United States Patent
Huang et al.

(10) Patent No.: US 10,192,940 B2
(45) Date of Patent: Jan. 29, 2019

(54) DOUBLE SIDED ORGANIC LIGHT-EMITTING DISPLAY APPARATUS AND ITS MANUFACTURING METHOD THEREOF

(71) Applicant: Wuhan China Star Optoelectronics Technology Co., Ltd., Wuhan, Hubei (CN)

(72) Inventors: Jhih-jie Huang, Guangdong (CN); Bo Liang, Guangdong (CN); Wei Wang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 238 days.

(21) Appl. No.: 15/111,230

(22) PCT Filed: Apr. 1, 2016

(86) PCT No.: PCT/CN2016/078264
§ 371 (c)(1),
(2) Date: Jul. 13, 2016

(87) PCT Pub. No.: WO2017/156801
PCT Pub. Date: Sep. 21, 2017

(65) Prior Publication Data
US 2018/0197926 A1    Jul. 12, 2018

(30) Foreign Application Priority Data
Mar. 16, 2016    (CN) .......................... 2016 1 0151250

(51) Int. Cl.
*H01L 29/08*    (2006.01)
*H01L 27/32*    (2006.01)
(Continued)

(52) U.S. Cl.
CPC ...... *H01L 27/3244* (2013.01); *H01L 51/0035* (2013.01); *H01L 51/0097* (2013.01);
(Continued)

(58) Field of Classification Search
CPC ............. H01L 27/3244; H01L 51/0035; H01L 51/0097; H01L 51/5271; H01L 51/56;
(Continued)

(56) References Cited

U.S. PATENT DOCUMENTS

2004/0227159 A1* 11/2004 Nakashima .......... G09G 3/3225
257/202
2004/0251817 A1    12/2004 Lu
(Continued)

FOREIGN PATENT DOCUMENTS

CN    1703126 A    11/2005
CN    1732494 A    2/2006
(Continued)

OTHER PUBLICATIONS

Machine translation Chinese Patent Application CN101163358.*

*Primary Examiner* — Dzung Tran
(74) *Attorney, Agent, or Firm* — Andew C. Cheng

(57) ABSTRACT

The present application discloses a double sided organic light-emitting display apparatus, including: a rigid substrate; a transmission flexible substrate and a reflective flexible substrate formed on the rigid substrate; a display substrate having a plurality of switching elements formed on the transmission flexible substrate and the reflective flexible substrate; and a top-emission OLED light-emitting layer and a bottom-emission OLED light-emitting layer formed on the display substrate, wherein the top-emission OLED light-emitting layer is corresponding to the reflective flexible substrate and the bottom-emission OLED light-emitting layer is corresponding to the transmission flexible substrate.

(Continued)

The present application also provides a method of manufacturing the OLED display apparatus. The OLED display apparatus can achieve the double sided display, and because of its use of the flexible substrate, it also has the advantage of ease of carrying and flexible property.

8 Claims, 3 Drawing Sheets

(51) Int. Cl.
  *H01L 51/00* (2006.01)
  *H01L 51/56* (2006.01)
  *H01L 51/52* (2006.01)

(52) U.S. Cl.
  CPC .......... *H01L 51/56* (2013.01); *H01L 51/5271* (2013.01); *H01L 2227/323* (2013.01); *H01L 2251/5323* (2013.01); *H01L 2251/5338* (2013.01)

(58) Field of Classification Search
  CPC ..... H01L 2251/5323; H01L 2251/5338; H01L 2227/323; H01L 51/5218; H01L 27/3211
  USPC ................................. 257/40, 59, 98; 347/238
  See application file for complete search history.

(56) References Cited

U.S. PATENT DOCUMENTS

| | | | |
|---|---|---|---|
| 2005/0151830 A1 | 7/2005 | Yamazaki | |
| 2005/0225705 A1* | 10/2005 | Chae | G02F 1/133555 349/114 |
| 2007/0194308 A1* | 8/2007 | Kuo | H01L 27/3267 257/40 |
| 2011/0148944 A1* | 6/2011 | Kobayashi | G09G 3/3225 345/690 |
| 2012/0032175 A1* | 2/2012 | Wang | H01L 27/3232 257/59 |
| 2013/0193843 A1* | 8/2013 | Yan | H05B 33/22 313/504 |
| 2016/0268362 A1* | 9/2016 | Shi | H01L 27/3267 |

FOREIGN PATENT DOCUMENTS

| | | |
|---|---|---|
| CN | 1816228 A | 8/2006 |
| CN | 101163358 A | 4/2008 |
| CN | 102636898 A | 8/2012 |
| CN | 202888240 U | 4/2013 |
| CN | 103227186 A | 7/2013 |
| CN | 103730484 A | 4/2014 |
| CN | 104155791 A | 11/2014 |
| CN | 104835415 A | 8/2015 |
| CN | 104851893 A | 8/2015 |

* cited by examiner

DOUBLE SIDED ORGANIC LIGHT-EMITTING DISPLAY APPARATUS AND ITS MANUFACTURING METHOD THEREOF

FIELD OF THE INVENTION

The present application relates to a display technology field, and more particularly to a double sided organic light-emitting display apparatus and its manufacturing method thereof.

BACKGROUND OF THE INVENTION

With the technology develop and the raising of people need to products, the display device is no longer limited to single-sided display, but comes with a double sided display device. The double sided display device can be applied to mobile phones, handheld computers and other mobile electronic equipment; it can also be used in banks, supermarkets and other places for business process.

The organic light emitting diode (OLED) display technology is different with the traditional LCD display technology, and no need of backlight and it has a self-luminous properties. A very thin coating of organic materials and the glass substrate is adopted. When a current is passed, these organic materials will extract light. Besides, the OLED displays can be made lighter and thinner, with larger viewing angle, and can save energy power significantly. In addition, a flexible display is with light, thin, foldable and portable and other outstanding advantages to achieve double sided display, and has slim and portable features. Therefore, how to provide a flexible OLED display to enable double sided display is a needed problem to be solved.

SUMMARY OF THE INVENTION

In order to solve the present technical problem mentioned above, the propose of the present application is to provide a double sided organic light-emitting display apparatus, including a rigid substrate; a transmission flexible substrate and a reflective flexible substrate formed on the rigid substrate; a display substrate having a plurality of switching elements formed on the transmission flexible substrate and the reflective flexible substrate; and a top-emission OLED light-emitting layer and a bottom-emission OLED light-emitting layer formed on the display substrate, wherein the bottom-emission OLED light-emitting layer is corresponding to the transmission flexible substrate and the top-emission OLED light-emitting layer is corresponding to the reflective flexible substrate.

Further, the number of the transmission flexible substrate and the reflective flexible substrate are one, and the number of the top-emission OLED light-emitting layer and a bottom-emission OLED light-emitting layer are one correspondingly.

Further, the number of the transmission flexible substrate is one and the number of the reflective flexible substrate are two, wherein the two reflective flexible substrates are formed separately on the opposite sides of the transmission flexible substrate; and the number of the top-emission OLED light-emitting layer are two and the number of the bottom-emission OLED light-emitting layer are one correspondingly wherein two of the top-emission OLED light-emitting layer are formed corresponding to two of the reflective flexible substrates separately.

Further, both the number of the transmission flexible substrate and the number of the reflective flexible substrate are more than one, wherein the plurality of the reflective flexible substrates and the plurality of the transmission flexible substrate are interlaced formed; and both the number of the top-emission OLED light-emitting layer and the number of the bottom-emission OLED light-emitting layer are more than one correspondingly, wherein the plurality of the top-emission OLED light-emitting layer and the plurality of the bottom-emission OLED light-emitting layer are interlaced formed.

The another purpose of the present application is to provide a manufacturing method for a double sided organic light-emitting display apparatus, including: providing a rigid substrate; forming a transmission flexible substrate and a reflective flexible substrate on the rigid substrate; forming a display substrate having a plurality of switching elements on the transmission flexible substrate and the reflective flexible substrate; and forming a top-emission OLED light-emitting layer and a bottom-emission OLED light-emitting layer on the display substrate, wherein the top-emission OLED light-emitting layer is corresponding to the reflective flexible substrate and the bottom-emission OLED light-emitting layer is corresponding to the transmission flexible substrate.

Further, a transmission flexible substrate and a reflective flexible substrate are formed on the rigid substrate; and a top-emission OLED light-emitting layer and a bottom-emission OLED light-emitting layer are formed on the display substrate correspondingly.

Further, a transmission flexible substrate is formed on the rigid substrate and two reflective flexible substrate are formed opposite on the two sides of the transmission flexible substrate; a bottom-emission OLED light-emitting layer is formed on the display substrate, and two top-emission OLED light-emitting layer are formed opposite on the two sides of the bottom-emission OLED light-emitting layer correspondingly, wherein the two of the top-emission OLED light-emitting layer are formed corresponding to the two of the reflective flexible substrate separately.

Further, a plurality of the transmission flexible substrate and a plurality of the reflective flexible substrate are interlaced formed on the rigid substrate; and a plurality of the top-emission OLED light-emitting layers and a plurality of the bottom-emission OLED light-emitting layer are interlaced formed on the display substrate, wherein the plurality of the bottom-emission OLED light-emitting layer are formed corresponding to the plurality of the transmission flexible substrate separately and the plurality of the top-emission OLED light-emitting layers are formed corresponding to the plurality of the reflective flexible substrate separately.

Further, the material of the transmission flexible substrate is selected from one or a combination of at least two material of polyimide, polyetherimide, polyphenylene sulfide or polyarylate, and the material of the reflective flexible substrate is selected from one or a combination of at least two material of yellow poly polyimides, polyetherimides, polyphenylene sulfide, or polyarylate.

The advantage of the present application is the OLED display apparatus can achieve the double sided display, and because of its use of the flexible substrate, it also has the advantage of ease of carrying and flexible property.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Figure 1:
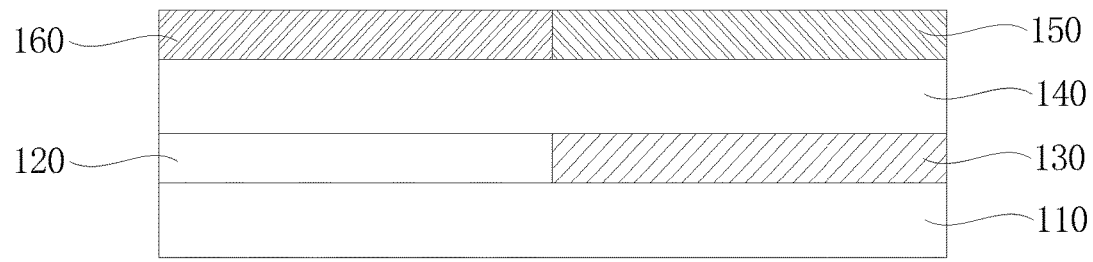
FIG. 1 illustrates a schematic structural view of a double sided organic light-emitting display apparatus according to a first embodiment of the present application.

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained should be considered within the scope of protection of the present application.

Specifically, the terminologies in the embodiments of the present application are merely for describing the purpose of the certain embodiment, but not to limit the invention. Examples and the appended claims be implemented in the present application requires the use of the singular form of the book "an", "the" and "the" are intended to include most forms unless the context clearly dictates otherwise. It should also be understood that the terminology used herein that "and/or" means and includes any or all possible combinations of one or more of the associated listed items.

In the drawings, in order to clarify the device, an exaggerated thickness of layers and regions are shown. The same reference numerals in the drawings refer to like elements throughout.

It can also be understood that when a layer or element is referred to as being formed on another layer or substrate or above or below, or it can be directly formed on the other layer or substrate, or under, or may be intervening layers or elements.

First Embodiment

Figure 2:
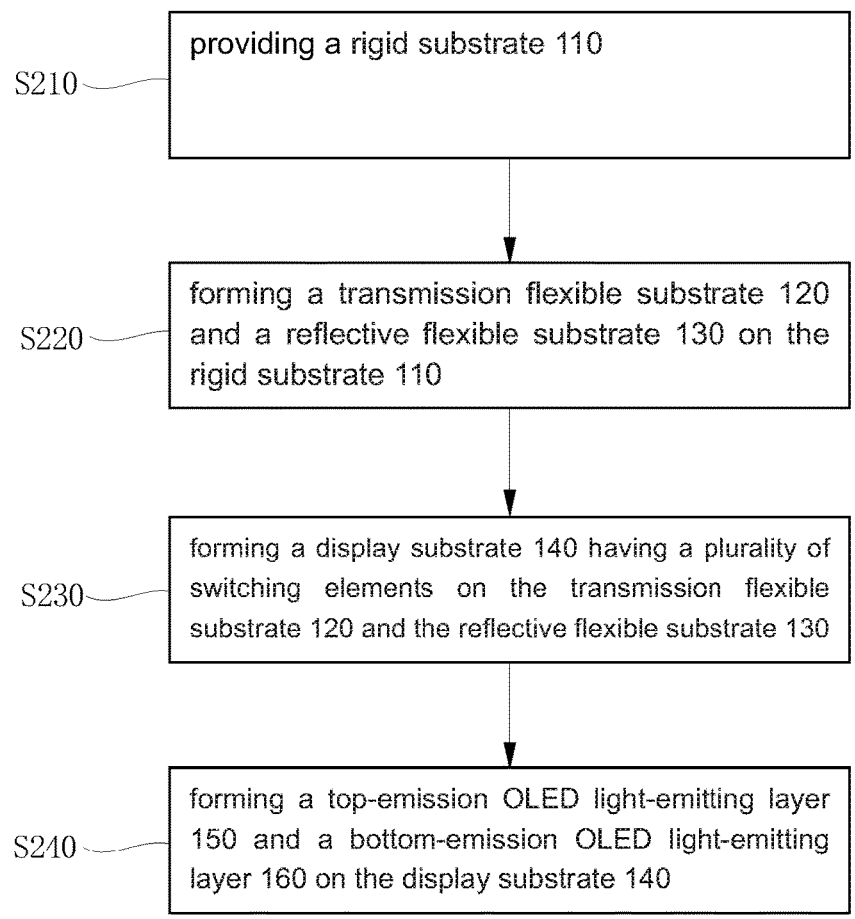
FIG. 2 illustrates a process flow of manufacturing the double sided organic light-emitting display apparatus of the first embodiment of the present application.

FIG. 1 illustrates a schematic structural view of a double sided organic light-emitting display apparatus according to a first embodiment of the present application. FIG. 2 illustrates a process flow of manufacturing the double sided organic light-emitting display apparatus of the first embodiment of the present application.

Referring to FIG. 1 and FIG. 2, in step S210, a rigid substrate 110 is provided. In the present embodiment, the rigid substrate 110 may be formed of glass or transparent material such as quartz, but the present application is not limited thereto.

In step S220, a transmission flexible substrate 120 and a reflective flexible substrate 130 is formed on the rigid substrate 110. In the present embodiment, the number of the transmission flexible substrate 120 and the reflective flexible substrate 130 are one, but the present application is not limited thereto.

Further, the material of the transmission flexible substrate 120 is selected from one or a combination of at least two material of polyimide, polyetherimide, polyphenylene sulfide or polyarylate. The material of the reflective flexible substrate 130 is selected from one or a combination of at least two material of yellow poly polyimides, polyetherimides, polyphenylene sulfide, or polyarylate.

Besides, to be noted that, the transmission flexible substrate 120 and the reflective flexible substrate 130 can be made sequentially or can be made simultaneously. The thickness of the transmission flexible substrate 120 and the reflective flexible substrate 130 are the same, but the occupied area (i.e., a plan view area) of the transmission flexible substrate 120 and the reflective flexible substrate 130 can be the same or different.

In step S230, a display substrate 140 with a plurality of switching elements formed on it is formed on the transmission flexible substrate 120 and the reflective flexible substrate 130. In the present embodiment, the switching element can be, for example, a thin film transistor (TFT). Further, the material of the active layer in the thin film transistor described herein can be amorphous silicon (a-Si), the low temperature polysilicon (LTPS), oxide semiconductor, carbon nanotube (CNT), graphene or the other.

In step S240, a top-emission OLED light-emitting layer 150 and a bottom-emission OLED light-emitting layer 160 are formed on the display substrate 140. In this embodiment, number of the top-emission OLED light-emitting layer 150 and the bottom-emission OLED light-emitting layer 160 are one, but the present application is not limited thereto.

Further, the bottom-emission OLED light-emitting layer 160 is formed corresponding to the transmission flexible substrate 120 to achieve the transmission display; the top-emission OLED light-emitting layer 150 is formed corresponding to the reflective flexible substrate 130 to achieve the reflective display.

Therefore, the OLED display apparatus of the present application can achieve the double sided display, and the OLED display apparatus of the present application can be bended in the contact area of the transmission flexible substrate 120 and the reflective flexible substrate 130 to form a specific angle double sided display.

Second Embodiment

Figure 3:
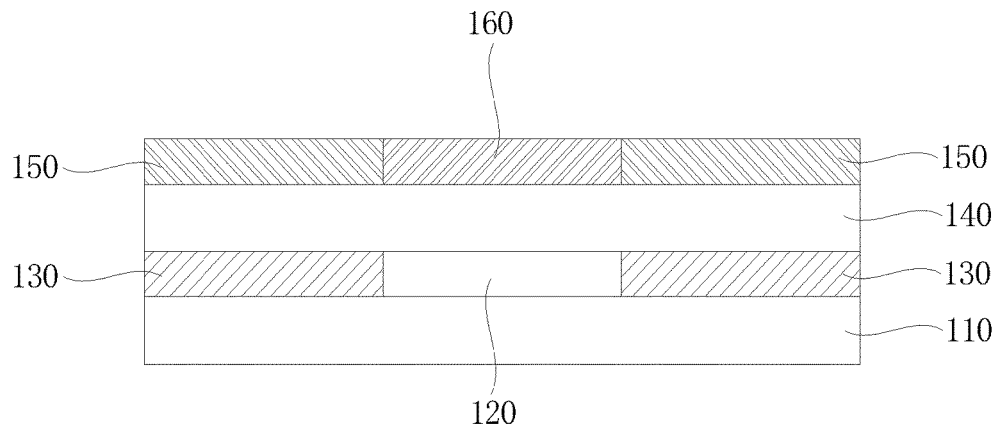
FIG. 3 illustrates a schematic structural view of a double sided organic light-emitting display apparatus according to a second embodiment of the present application.
Figure 4:
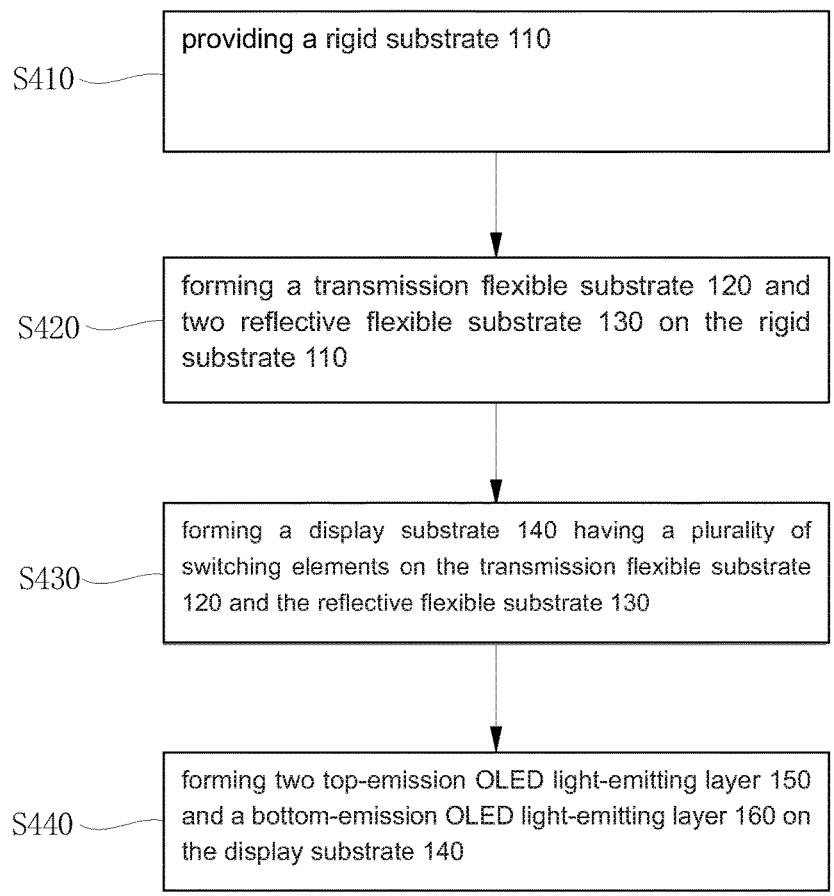
FIG. 4 illustrates a process flow of manufacturing the double sided organic light-emitting display apparatus of the second embodiment of the present application.

FIG. 3 illustrates a schematic structural view of a double sided organic light-emitting display apparatus according to the second embodiment of the present application. FIG. 4 illustrates a process flow of manufacturing the double sided organic light-emitting display apparatus of the second embodiment of the present application.

Referring to FIG. 3 and FIG. 4, in step S410, a rigid substrate 110 is provided. In the present embodiment, the rigid substrate 110 may be formed of glass or transparent material such as quartz, but the present application is not limited thereto.

In step S420, one transmission flexible substrate 120 and two reflective flexible substrates 130 is formed on the rigid substrate 110. Wherein the two reflective flexible substrates 130 are formed separately on the opposite sides of the transmission flexible substrate 120. In the present embodiment, the number of the transmission flexible substrate 120 and the reflective flexible substrate 130 are two, but the present application is not limited thereto. Further, the material of the transmission flexible substrate 120 is selected from one or a combination of at least two material of polyimide, polyetherimide, polyphenylene sulfide or polyarylate. The material of the reflective flexible substrate 130 is selected from one or a combination of at least two material of yellow poly polyimides, polyetherimides, polyphenylene sulfide, or polyarylate.

Besides, to be noted that, the transmission flexible substrate 120 and the reflective flexible substrate 130 can be made sequentially or can be made simultaneously. The thickness of the transmission flexible substrate 120 and the reflective flexible substrate 130 are the same, but the occupied area (i.e., a plan view area) of the transmission flexible substrate 120 and the reflective flexible substrate 130 can be the same or different.

In step S430, a display substrate 140 with a plurality of switching elements formed on it is formed on the transmission flexible substrate 120 and the reflective flexible substrate 130. In the present embodiment, the switching element can be, for example, a thin film transistor (TFT). Further, the material of the active layer in the thin film transistor described herein can be amorphous silicon (a-Si), the low temperature polysilicon (LTPS), oxide semiconductor, carbon nanotube (CNT), graphene or the other.

In step S440, two top-emission OLED light-emitting layers 150 and one bottom-emission OLED light-emitting layer 160 are formed on the display substrate 140. In this embodiment, number of the top-emission OLED light-emitting layer 150 is two and the number of the bottom-emission OLED light-emitting layer 160 are one, but the present application is not limited thereto.

Further, one of the bottom-emission OLED light-emitting layers 160 is formed corresponding to the transmission flexible substrate 120 to achieve the transmission display; the two of the top-emission OLED light-emitting layer 150 is formed corresponding to two of the reflective flexible substrate 130 accordingly to achieve the reflective display separately.

Therefore, the OLED display apparatus of the present application can achieve the double sided display, and the OLED display apparatus of the present application can be bended in the contact area of the transmission flexible substrate 120 and the reflective flexible substrate 130 to form a specific angle double sided display.

Third Embodiment

Figure 5:
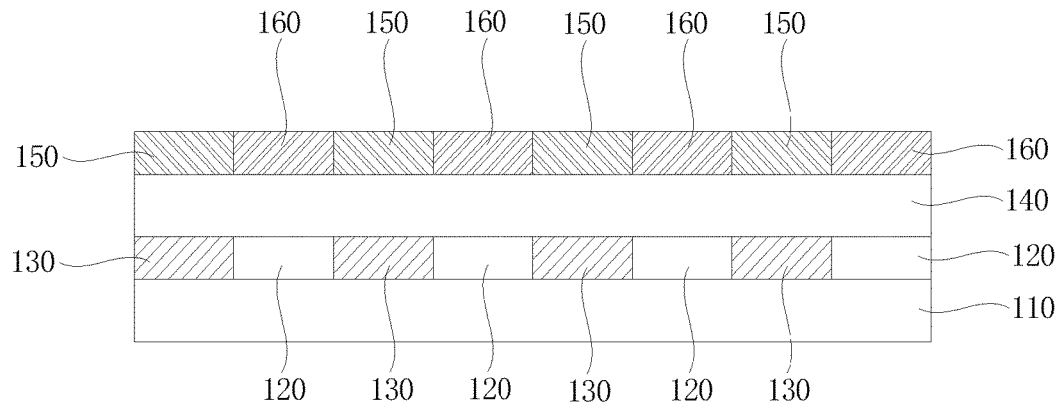
FIG. 5 illustrates a schematic structural view of a double sided organic light-emitting display apparatus according to a third embodiment of the present application.
Figure 6:
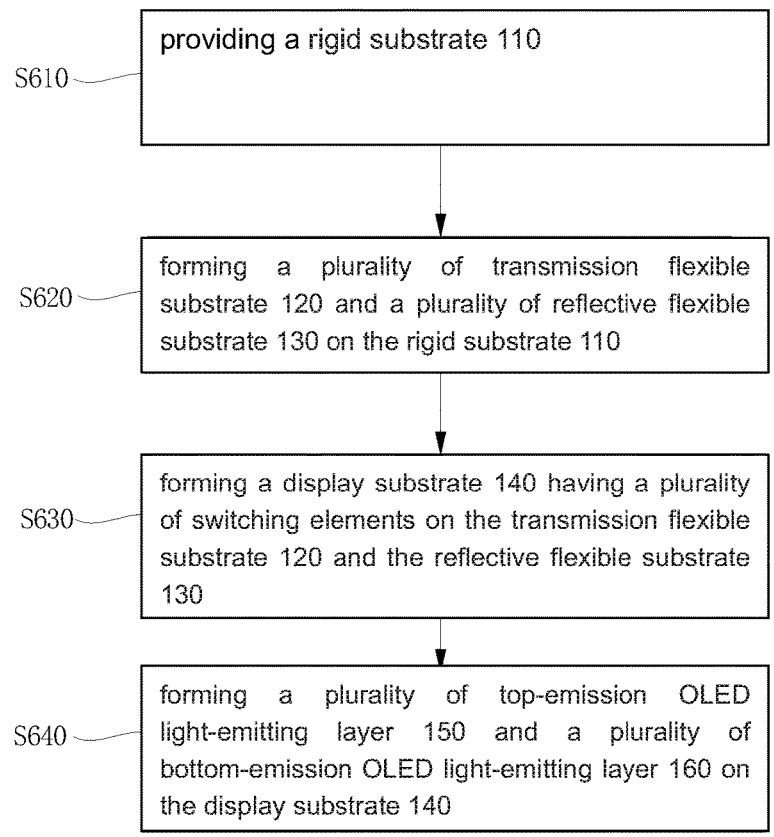
FIG. 6 illustrates a process of manufacturing the double sided organic light-emitting display apparatus of the third embodiment of the present application.

FIG. 5 illustrates a schematic structural view of a double sided organic light-emitting display apparatus according to the second embodiment of the present application. FIG. 6 illustrates a process flow of manufacturing the double sided organic light-emitting display apparatus of the second embodiment of the present application.

Referring to FIG. 5 and FIG. 6, in step S610, a rigid substrate 110 is provided. In the present embodiment, the rigid substrate 110 may be formed of glass or transparent material such as quartz, but the present application is not limited thereto.

In step S620, a plurality of the transmission flexible substrates 120 and a plurality of the reflective flexible substrates 130 are formed on the rigid substrate 110. Wherein the plurality of the transmission flexible substrates 120 and the plurality of the reflective flexible substrates 130 are interlaced formed to each other.

Further, the material of the transmission flexible substrate 120 is selected from one or a combination of at least two material of polyimide, polyetherimide, polyphenylene sulfide or polyarylate. The material of the reflective flexible substrate 130 is selected from one or a combination of at least two material of yellow poly polyimides, polyetherimides, polyphenylene sulfide, or polyarylate.

Besides, to be noted that, the transmission flexible substrate 120 and the reflective flexible substrate 130 can be made sequentially or can be made simultaneously. The thickness of the transmission flexible substrate 120 and the reflective flexible substrate 130 are the same, but the occupied area (i.e., a plan view area) of the transmission flexible substrate 120 and the reflective flexible substrate 130 can be the same or different.

In step S630, a display substrate 140 with a plurality of switching elements formed on it is formed on the transmission flexible substrate 120 and the reflective flexible substrate 130. In the present embodiment, the switching element can be, for example, a thin film transistor (TFT). Further, the material of the active layer in the thin film transistor described herein can be amorphous silicon (a-Si), the low temperature polysilicon (LTPS), oxide semiconductor, carbon nanotube (CNT), graphene or the other.

In step S640, a plurality of the top-emission OLED light-emitting layers 150 and a plurality of the bottom-emission OLED light-emitting layer 160 are formed on the display substrate 140. Wherein the plurality of the top-emission OLED light-emitting layers 150 and the plurality of the bottom-emission OLED light-emitting layer 160 are interlaced formed to each other.

Further, each of the plurality of the bottom-emission OLED light-emitting layer 160 is formed corresponding to each of the plurality of the transmission flexible substrate 120 accordingly to achieve the transmission display; each of the plurality of the top-emission OLED light-emitting layer 150 is formed corresponding to each of the plurality of the reflective flexible substrate 130 accordingly to achieve the reflective display separately. It should be noted that, when the line width of the transmission flexible substrate 120 and the reflective flexible substrate 130 is thin to a sufficiently level, for example, to the level that the naked eye cannot distinguish. The OLED display apparatus according to the embodiment of the present application can totally achieve the back to back double sided display.

Therefore, the OLED display apparatus of the present application can achieve the double sided display, and the OLED display apparatus of the present application can be bended in the contact area of the transmission flexible substrate 120 and the reflective flexible substrate 130 to form a specific angle double sided display.

Above are embodiments of the present application, which does not limit the scope of the present application. Any modifications, equivalent replacements or improvements within the spirit and principles of the embodiment described above should be covered by the protected scope of the invention.

What is claimed is:

1. A manufacturing method for a double sided organic light-emitting display apparatus, comprising:
   providing a rigid substrate;
   forming at least one transmission flexible substrate and at least one reflective flexible substrate on the rigid substrate;

forming a display substrate having a plurality of switching elements on the at least one transmission flexible substrate and the at least one reflective flexible substrate; and forming at least one top-emission OLED light-emitting layer and at least one bottom-emission OLED light-emitting layer on the display substrate, wherein the at least one top-emission OLED light-emitting layer is corresponding to the at least one reflective flexible substrate and the at least one bottom-emission OLED light-emitting layer is corresponding to the at least one transmission flexible substrate;

wherein the at least one transmission flexible substrate and the at least one reflective flexible substrate are formed on a surface of the rigid substrate and are spaced from and corresponding to the at least one bottom-emission OLED light-emitting layer and the at least one top-emission OLED light-emitting layer, such that the at least one top-emission OLED light-emitting layer is separated by the display substrate from the at least one reflective flexible substrate.

2. A manufacturing method according to claim 1, wherein the at least one transmission flexible substrate comprises a transmission flexible substrate and the at least one reflective flexible substrate comprises a reflective flexible substrate, wherein the transmission flexible substrate and the reflective flexible substrate are formed on the rigid substrate; and the at least one top-emission OLED light-emitting layer comprises a top-emission OLED light-emitting layer and the at least one bottom-emission OLED light-emitting layer comprises a bottom-emission OLED light-emitting layer, wherein the top-emission OLED light-emitting layer and the bottom-emission OLED light-emitting layer are formed on the display substrate to respectively correspond to the reflective flexible substrate and the transmission flexible substrate.

3. A manufacturing method according to claim 1, wherein the at least one transmission flexible substrate comprises a transmission flexible substrate that is formed on the rigid substrate and the at least one reflective flexible substrate comprises two reflective flexible substrate that are formed on the rigid substrate and respectively located on two sides of the transmission flexible substrate; and the at least one bottom-emission OLED light-emitting layer comprises a bottom-emission OLED light-emitting layer that is formed on the display substrate, and the at least one top-emission OLED light-emitting layer comprises two top-emission OLED light-emitting layers that are formed on the display substrate and located on two sides of the bottom-emission OLED light-emitting layer, wherein the two top-emission OLED light-emitting layers are formed to correspond to the two reflective flexible substrates respectively.

4. A manufacturing method according to claim 1, wherein the at least one transmission flexible substrate comprises a plurality of the transmission flexible substrates and the at least one reflective flexible substrate comprises a plurality of the reflective flexible substrates, wherein the plurality of transmission flexible substrates and the plurality of reflective flexible substrates are formed on the rigid substrate so as to be alternate with each other; and the at least one top-emission OLED light-emitting layer comprises a plurality of top-emission OLED light-emitting layers and the at least one bottom-emission OLED light-emitting layer comprises a plurality of bottom-emission OLED light-emitting layers, wherein the plurality of top-emission OLED light-emitting layers and the plurality of bottom-emission OLED light-emitting layers are formed on the display substrate so as to be alternate with each other, wherein the plurality of bottom-emission OLED light-emitting layers are formed to correspond to the plurality of the transmission flexible substrates respectively and the plurality of top-emission OLED light-emitting layers are formed to correspond to the plurality of reflective flexible substrates respectively.

5. A manufacturing method according to claim 1, wherein a material of the transmission flexible substrate is selected from one or a combination of at least two materials of polyimide, polyetherimide, polyphenylene sulfide or polyarylate, and a material of the reflective flexible substrate is selected from one or a combination of at least two materials of yellow poly polyimides, polyetherimides, polyphenylene sulfide, or polyarylate.

6. A manufacturing method according to claim 2, wherein a material of the transmission flexible substrate is selected from one or a combination of at least two materials of polyimide, polyetherimide, polyphenylene sulfide or polyarylate, and a material of the reflective flexible substrate is selected from one or a combination of at least two materials of yellow poly polyimides, polyetherimides, polyphenylene sulfide, or polyarylate.

7. A manufacturing method according to claim 3, wherein a material of the transmission flexible substrate is selected from one or a combination of at least two materials of polyimide, polyetherimide, polyphenylene sulfide or polyarylate, and a material of the reflective flexible substrate is selected from one or a combination of at least two materials of yellow poly polyimides, polyetherimides, polyphenylene sulfide, or polyarylate.

8. A manufacturing method according to claim 4, wherein a material of the transmission flexible substrate is selected from one or a combination of at least two materials of polyimide, polyetherimide, polyphenylene sulfide or polyarylate, and a material of the reflective flexible substrate is selected from one or a combination of at least two materials of yellow poly polyimides, polyetherimides, polyphenylene sulfide, or polyarylate.

* * * * *